United States Patent [19]

Garskamp

[11] Patent Number: 4,499,605
[45] Date of Patent: Feb. 12, 1985

[54] FM-RECEIVER USING A RATIO DETECTOR WITH SILICON DIODES

[75] Inventor: Arnoldus Garskamp, Eindhoven, Netherlands

[73] Assignee: U.S. Philips Corporation, New York, N.Y.

[21] Appl. No.: 435,145

[22] Filed: Oct. 18, 1982

[30] Foreign Application Priority Data

Nov. 13, 1981 [NL] Netherlands ............... 8105147

[51] Int. Cl.³ .............................................. H04B 1/16
[52] U.S. Cl. .................................... 455/210; 455/214; 455/311; 329/130
[58] Field of Search ............... 455/205, 210, 211, 214, 455/307, 339, 311, 312; 329/129, 130

[56] References Cited

U.S. PATENT DOCUMENTS

| 2,501,077 | 3/1950 | Murakami | 329/130 |
| 3,588,721 | 6/1971 | Keller | 329/129 |
| 3,633,134 | 1/1972 | Barrows | 455/339 |
| 4,225,975 | 9/1980 | Iwamoto | 455/214 |

Primary Examiner—Jin F. Ng
Attorney, Agent, or Firm—Thomas A. Briody; William J. Streeter; Charles E. Quarton

[57] ABSTRACT

An FM-receiver having an FM-channel successively comprising an RF-input stage and mixer stage (B), an IF-circuit (A) and a ratio detector (R). The ratio detector incorporates silicon detector diodes and a smoothing capacitor conductively connected to the detector diodes for a dynamic amplitude limitation of the ratio detector output signal in dependence on the amplitude of the ratio detector input signal. A bias voltage is applied to the silicon diodes to prevent the silicon diodes from being blocked at signals lower than the threshold voltage of the diodes. The bias voltage comprises an average noise voltage that is generated by amplifying a noise component of the FM signal, the noise component being present in the IF bandwidth. The average noise voltage is predominantly obtained by amplifying the noise produced within the IF-passband of the IF-input stage.

3 Claims, 5 Drawing Figures

FM-RECEIVER USING A RATIO DETECTOR WITH SILICON DIODES

BACKGROUND OF THE INVENTION

The invention relates to an FM-receiver comprising an FM-channel coupled to an aerial input, the FM-channel comprising in succession an RF-input stage, a mixer stage, an IF-circuit and a ratio detector, the ratio detector incorporating silicon diodes for detection of an FM-signal in said FM-channel as well as a smoothing capacitor which is conductively connected to said diodes for a dynamic amplitude limitation of the ratio detector output signal in dependence on the amplitude of the ratio detector input signal.

Such an FM-receiver is employed in the Philips television receiver type R 17 B 720 and is published in printed form in the manual thereof.

In practice, an unwanted amplitude modulation of the FM-signal to be processed in an FM-receiver may be produced due to inter alia transmission noise, multipath reception, a disadvantageous transmitter location, frequencies of unwanted transmitters close to the carrier frequency of the desired signal then occurring, edge detection on the side edges of the IF-bandpass response, etc. In the known FM-receiver this unwanted amplitude modulation is predominantly suppressed at large input signals by amplitude limitation of the output signal of the FM-circuit and at small input signals by integration via the smoothing capacitor of the ratio detector.

The amplitude of the input signal at which the limiting action in the amplifier/limiter stages of the IF-circuit starts determines the input sensitivity of the FM-receiver. If this amplitude is small then the input sensitivity is high and vice versa. The ratio detector of the prior art FM-receiver provides a low input sensitivity while maintaining a suppression of amplitude variations at also those input signals at which the amplifier/limiter stages of the IF-circuit are not limiting. Consequently, the prior art FM-receiver is rather insensitive to interferences owing to, for example, noise and/or rapid field strength fluctuations, also when small signals are received, which is of particular importance in mobile FM-reception. It also shows a non-aggressive tuning behaviour without the need for additional circuits, such as, for example, a muting circuit.

In the present state of the art it is, however, costly and complicated to realize adequately small signal processing in a ratio detector. In the ratio detector of the known FM-receiver use is made of silicon diodes as detection diodes. As will be known, silicon diodes have a threshold voltage which, depending on inter alia the configuration and the diode surface area, may be between approximately 450 and 700 mV. In order to obtain a correct detection of FM-signals having an amplitude smaller than this threshold voltage the silicon diodes of the ratio detector must remain in the conductive state also at such small signal amplitudes. In the known FM-receiver this is realized by means of a bias circuit which applies a diode biasing current to said silicon diodes. Such a biasing circuit is, however, costly and complicated. In addition, the diode bias currents introduce in the tuned state an unwanted d.c. voltage component in the output voltage of the ratio detector, as a result of which this output voltage is not suitable for AFC.

It is also known to use germanium diodes as detection diodes. Since germanium diodes exhibit a much lower threshold voltage than silicon diodes the use of a biasing circuit is not necessary. However, germanium diodes are much more expensive than silicon diodes. In addition, in contrast with silicon diodes, they are not integrateable.

It is an object of the invention to provide an FM-receiver which compared with the prior art FM-receiver can be realized in a simpler and cheaper manner and has at least the same advantageous properties.

SUMMARY OF THE INVENTION

According to the invention, an FM-receiver of the type described in the opening paragraph is characterized in that the noise generated in the part of the FM-channel preceding the silicon detector diodes of the ratio detector applies to the diodes an average noise voltage which corresponds to the threshold voltage of the silicon detector diodes and an average noise current which is equal to the diode forward current, this average noise current producing a d.c. voltage deviating from zero across the smoothing capacitor.

The invention is based on the recognition that the minimum noise required at the silicon diodes for an adequate diode bias does not necessarily noticeably reduce the signal-to-noise ratio of the overall FM-receiver.

When the measure in accordance with the invention is used, the noise voltage applied to the silicon diodes of the ratio detector causes by means of peak detection across the detection circuits subsequent to the silicon diodes a d.c. voltage which is at least equal to the threshold voltage of these silicon diodes. As a result thereof these silicon diodes remain conductive, without an additional biasing current even at very small signal amplitudes. This ensures, specifically for those signals, which are not limited when the IF-portion is out of limitation, on the one hand a proper detection and on the other hand an effectual and continuously operating dynamic amplitude limitation. In addition, as there is no additional biasing current, the output voltage of the ratio detector is suitable for AFC and the FM-receiver in accordance with the invention can be realized in a simple and cheap manner.

The use of silicon diodes in a ratio detector without biasing circuit is known per se from the article "Super high quality FM-detector and its development process", by S. Inoue and Y. Isa, published in "I.E.E.E. Transactions on Consumer Electronics", Volume CE-24, No. 3, August 1978, pages 226–234. The sensitivity of the FM-receiver in which this prior art ratio detector is employed is, however, very high so that amplitude variations are only suppressed by a limitation of the IF-output signal. The IF-FM-signals applied to the ratio detector therefore reach the maximum limiting value already at a very small input amplitude and, during normal usage, always exceeds the threshold voltage of the silicon diodes. The problems as regards the detection and the limitation of small signals such as they occur in the first-mentioned state of the art, do not occur here. The article does not contain any indication that these problems can be solved by dimensioning the portion of the FM-channel preceding the silicon diodes of the ratio detector as regards noise in accordance with the measure according to the invention.

A preferred embodiment of the FM-receiver in accordance with the invention is characterized in that the noise factor at the RF-input is at least 4 dB, the 3 dB-bandwidth of the IF-circuit is at least 100 kHz and the input sensitivity has a value less than 30 μV/3 dB.

When this measure is used the noise generated in the RF-input stage within the IF-passband is adequately amplified to produce at the silicon diodes of the ratio detector a d.c. voltage which is at least of the same value as the threshold voltage of these silicon diodes.

A further preferred embodiment is characterized in that the noise factor of the RF-input stage is 5 dB, the 3 dB-bandwidth of the IF-circuit is 150 kHz and the input sensitivity has a value of 10 μV/3 dB.

When this measure is used, the FM-receiver is particularly suitable for use as a car radio.

BRIEF DESCRIPTION OF THE DRAWINGS

The invention will now be further described with reference to the Figures shown by way of example in the accompanying drawings in which.

DESCRIPTION OF THE PREFERRED EMBODIMENTS

Figure 1:
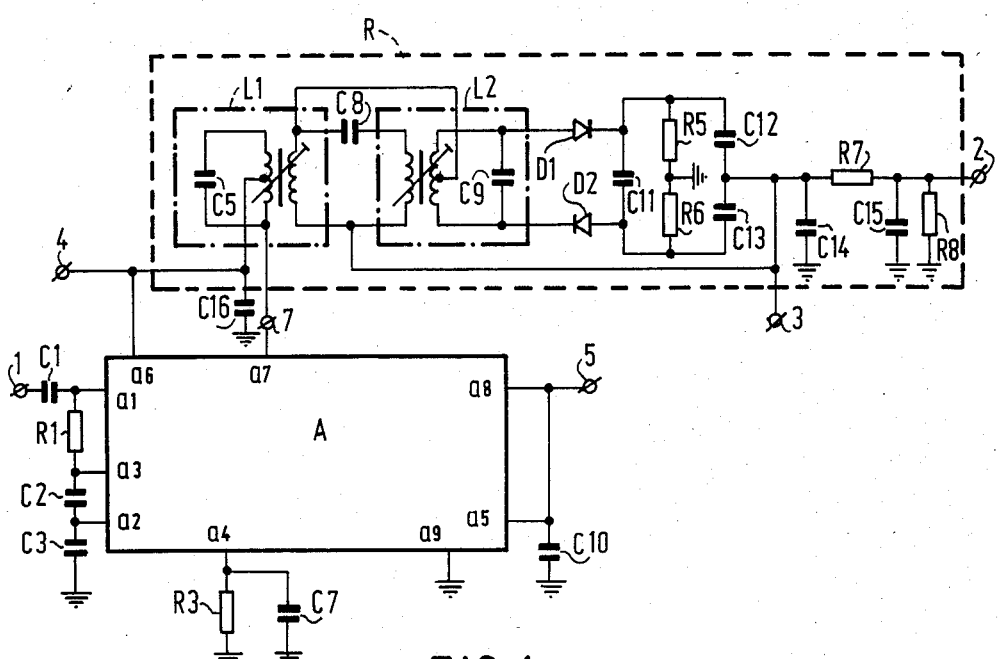
FIG. 1 shows the circuit diagram of an IF-circuit and a ratio detector for use in an FM-receiver in accordance with the invention.

FIG. 1 shows an integrated IF-circuit A of the type TEA 5560 having terminals $a_1$ to $a_9$, inclusive. The indices at the terminal reference numerals correspond to the terminal reference numerals as given in the manual associated with this integrated IF-circuit A.

For a proper operation of the IF-circuit A the terminal $a_9$ is connected to ground and a supply voltage of between 10.2 to 16 V is applied to the terminal $a_6$ via a supply terminal 4. The supply terminal 4 is AC-connected to ground via a grounded capacitor $C_{16}$. The terminal $a_5$ is connected to a +8 V stabilized supply voltage produced by the IF-circuit A and to a grounded decoupling capacitor $C_{10}$. The terminal $a_1$ which is connected to an IF-input 1 via a coupling capacitor $C_1$ is coupled via a resistor $R_1$ to the terminal $a_3$ which itself is connected to the terminal $a_2$ via a decoupling capacitor $C_2$. The terminal $a_2$ is connected to a grounded capacitor $C_3$. The terminal $a_4$ is connected to ground via a resistor $R_3$ and a.c. connected through a grounded capacitor $C_7$.

The terminal $a_7$ which forms the output terminal of the IF-circuit A applies an IF-output signal to an input 7 of the ratio detector R. The ratio detector R comprises two detector coil arrangements $L_1$ and $L_2$ which are connected to the input 7 and are interconnected in the manner shown and which is known per se from "Philips Data Handbook—Electronic Components and Materials", Part 5B, March 1977, using capacitors $C_5$, $C_8$ and $C_9$. The detector coil arrangement $L_2$ has two outputs which are conductively coupled in known manner via respective silicon diodes $D_1$ and $D_2$, which are arranged in anti-phase, to on the one hand a smoothing capacitor $C_{11}$ arranged between the two silicon diodes $D_1$ and $D_2$ for a dynamic amplitude limitation and on the other hand to detection circuits $R_5$, $C_{12}$ and $R_6$, $C_{13}$, respectively for the FM-signal detection.

The resistors $R_5$ and $R_6$ are connected to ground and the capacitors $C_{12}$ and $C_{13}$ are connected on the one hand to an output 2 of the ratio detector R via an RC-Ω network formed by a series resistor $R_7$, two capacitors $C_{14}$ and $C_{15}$ arranged on both sides of the series resistor $R_7$ as well as a load resistor $R_8$ which for an adequate measurement is arranged in parallel with the capacitor $C_{15}$ and on the other hand to an AFC-output 3.

In a practical embodiment the silicon diodes $D_1$ and $D_2$ are of the type BA 316 and have a threshold voltage of approximately 450 mV. The detector coil arrangements $L_1$ and $L_2$ are of the type 3122 138.20211 and 3122 138.20212, respectively. The resistors and capacitors employed have the following values:

| Resistors | Valve (Ω) | Capacitors | Valve (F) |
|---|---|---|---|
| $R_1$ | 330 | $C_1$ | 2,2 n |
| $R_3$ | 2,2K | $C_2$ | 22 n |
| $R_5$ | 5,6K | $C_3$ | 22 n |
| $R_6$ | 5,6K | $C_5$ | 82 p |
| $R_7$ | 1K | $C_7$ | 4,7μ |
| $R_8$ | 47K | $C_8$ | 33 p |
|  |  | $C_9$ | 82 p |
|  |  | $C_{10}$ | 2,2μ |
|  |  | $C_{11}$ | 1μ |
|  |  | $C_{12}$ | 4,7 n |
|  |  | $C_{13}$ | 4,7 n |
|  |  | $C_{14}$ | 2,2 n |
|  |  | $C_{15}$ | 220 p |

Considered by itself, the operation of the IF-circuit A and the ratio detector R as regards the limiting of amplitude variations and in the FM-detection predominantly corresponds to the operation of the corresponding circuits of the first-mentioned prior art FM-receiver, without the use of a biasing circuit. This operation may therefore be assumed as being known.

The input sensitivity of the IF-circuit A is adjusted, in the manner to be described with reference to FIG. 3, to 150 μV/3 dB. This means that at an IF-input signal of 150 μV the amplitude of the IF-output signal at the output terminal $a_7$ is less by half, i.e. 3 dB, than the amplitude at full limitation.

Figure 2:
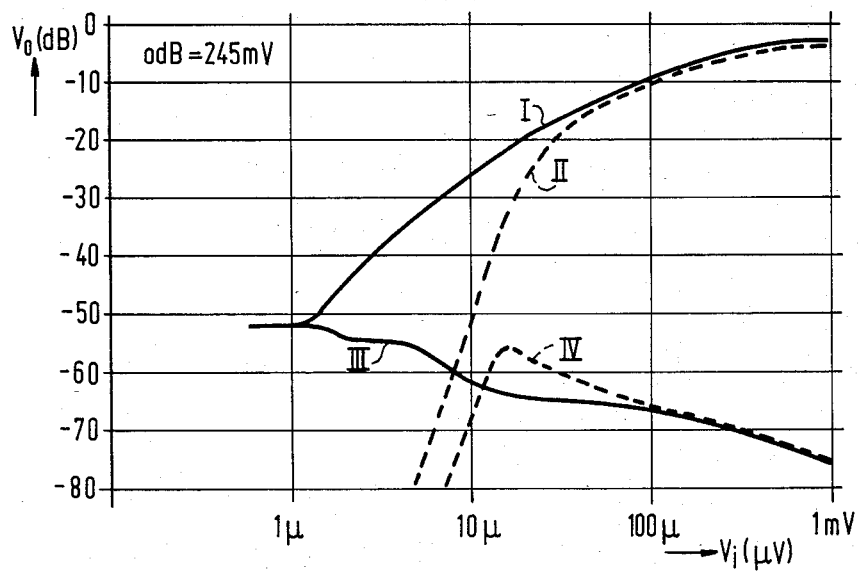
FIG. 2 shows some curves in which the variation of the amplitude of the output signal of the ratio detector is plotted as a function of an IF-FM-signal applied to the IF-input, on the one hand when germanium diodes and on the other hand when silicon diodes are used.

FIG. 2 shows by means of curve I when germanium diodes of the type AA 119 are used as the diodes $D_1$ and $D_2$, and by means of a dotted curve II when silicon diodes of the said type BA 316 are used as the diodes $D_1$ and $D_2$, the variation of the amplitudes of the output signal of the ratio detector R at the output 2 as a function of the amplitude of an IF-FM-input test signal applied to the input terminal $a_1$ of the IF-circuit A via the coupling capacitor $C_1$, this input test signal having a centre frequency of 10.7 MHz, a frequency swing of 22.5 kHz and a modulation frequency of 1 kHz. In addition to the modulation signal, this output signal also comprises the noise produced in the IF-circuit A and in the ratio detector A owing to, for example, thermal or diode emission.

The same procedure as in the preceding paragraph is effected with a non-modulated 10.7 MHz IF-input test signal. Curve III shows as a function of the amplitude of the non-modulated 10.7 MHz IF-input test signal the variation of the noise amplitude at the output 2 of the ratio detector R when germanium diodes are used as the detection diodes $D_1$ and $D_2$ and a dotted curve IV shows the same variation when silicon diodes are used in the ratio detector R.

Below input values of 40 μV the effect of the low threshold voltage of germanium diodes (approximately 200 mV) and the effect of the high threshold voltage of silicon diodes (approximately 450 mV) can be clearly observed. When germanium diodes are used, an adequate FM-detection is ensured at a decreasing amplitude until the signal disappears in the noise, at approximately 1 μV. When silicon diodes are used the amplitude of the ratio detector output signal decreases rather quickly below input signal amplitudes of 40 μV, owing to the silicon diodes are cutoff. In response thereto, at a further increasing input amplitude the noise level first increases somewhat and, thereafter, below an input amplitude of approximately 15 μV, it rapidly decreases. The absence of a measure to keep the silicon diodes $D_1$ and $D_2$ in the conducting state, also for small signals, consequently renders a proper small signal detection impossible.

Figure 3:
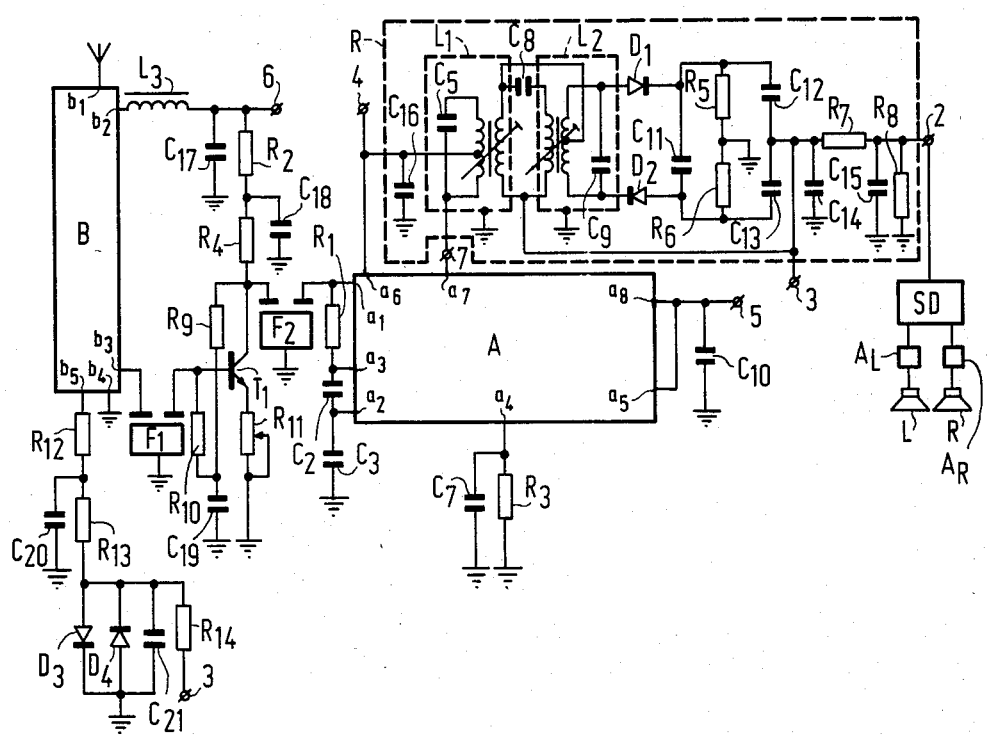
FIG. 3 shows the circuit diagram of an FM-receiver in accordance with the invention.

FIG. 3 shows an FM-receiver in accordance with the invention in which the IF-circuit A and the ratio detector R with silicon diodes $D_1$ and $D_2$ are incorporated. The elements corresponding to the elements of FIG. 1 are given the same reference numerals. The FM-receiver comprises an RF-input and mixer stage B of the type MMK 11E11, mark ALPS, which has an aerial input $b_1$, a supply terminal $b_2$, an output terminal $b_3$, a ground terminal $b_4$ and an AFC-input terminal $b_5$.

Via a first ceramic IF-filter $F_1$ the output terminal $b_3$ is connected to the base of a transistor $T_1$. This transistor $T_1$ is used to adjust the input sensitivity of the FM-receiver and to compensate for the losses in the IF-filter $F_1$ and a second ceramic IF-filter $F_2$. The collector of the transistor $T_1$ is connected to the input terminal $a_1$ of the IF-circuit A via the second IF-filter $F_2$. The output 2 of the ratio detector R is connected to a stereo decoder SD which applies left and right stereophonic signals to the left and right loudspeakers L and R via left and right audio amplifiers $A_L$ and $A_R$.

The further elements shown are used for an adequate adjustment of the said circuits. So, the supply terminal $b_2$ is connected to a supply input 6 via an LC smoothing filter and the AFC input terminal $b_5$ is connected in the manner shown to the AFC-output 3 of the ratio detector R via resistors $R_{12}$, $R_{13}$ and $R_{14}$, an amplitude diode limiter $D_3$, $D_4$ and grounded capacitors $C_{20}$ and $C_{21}$. Via resistors $R_{10}$ and $R_9$ the base of the transistor $T_1$ is connected to the collector, this collector being connected to the supply input 6 via collector resistors $R_4$ and $R_2$. Via a variable emitter resistor $R_{11}$ the emitter of the transistor $T_1$ is connected to ground, which emitter resistor is used to adjust the gain of the transistor $T_1$ and consequently the input sensitivity of the FM-receiver. The resistors $R_9$ and $R_{10}$ are connected to ground via a grounded capacitor $C_{19}$ and the resistors $R_2$ and $R_4$ are connected to ground via a grounded capacitor $C_{18}$.

In a practical embodiment the noise factor of the RF-input and mixer stage B was 5 dB; the 3 dB-IF bandwidth of the ceramic filters $F_1$ and $F_2$ was 150 kHz; and the input sensitivity of the FM-receiver 10 μV/3 dB. Consequently, the FM-receiver shown is particularly suitable for use as a mobile FM-receiver.

The two ceramic filters $F_1$ and $F_2$ were of the type BF 240 and the diodes $D_3$ and $D_4$ of the amplitude diode limiter were of the type BA 315. As mentioned in the foregoing, the silicon detection diodes $D_1$, $D_2$ of the ratio detector were of the type BA 316.

The values of the further elements were:

| Resistors | Valve (Ω) | Capacitors | Valve (F) | Coils | Valve (H) |
|---|---|---|---|---|---|
| $R_2$ | 4,7K | $C_{17}$ | 22 n | $L_3$ | 100μ |
| $R_4$ | 330 | $C_{18}$ | 10 n | | |
| $R_9$ | 270K | $C_{19}$ | 10 n | | |
| $R_{10}$ | 330 | $C_{20}$ | 2,7 n | | |
| $R_{11}$ | 470 (maximum) | $C_{21}$ | 0,33μ | | |
| $R_{12}$ | 47K | | | | |
| $R_{13}$ | 1K | | | | |
| $R_{14}$ | 330K | | | | |

An aerial signal applied to the input terminal $b_1$ of the RF-input and mixer stage B is filtered, amplified and mixed in known manner to a centre frequency of 10.7 MHz. The IF-FM-signal thus obtained is thereafter filtered in the IF-filter $F_1$ and adjusted to a predetermined amplitude level by means of the transistor $T_1$ for the adjustment of a desired input sensitivity. Thereafter a further IF-selection is effected in the IF-filter $F_2$ and the IF-signal is processed in the manner described in the foregoing to form audio-frequency left and right stereo signals.

In the embodiment shown the noise factor of the RF-input terminal was, as mentioned already, 5 dB. The RF-input noise was then 0.66 μV and a voltage of 2 mV was measured across the smoothing capacitor $C_{11}$. From this it may be concluded that in these circumstances the silicon diodes $D_1$ and $D_2$ were conducting and that consequently there was a diode bias across each of the detection circuits $R_5$, $C_{12}$ and $R_6$, $C_{13}$ of at least 450 mV threshold voltage. Starting therefrom, the total gain of the aerial input $b_1$ to the silicon detection diodes $D_1$, $D_2$ was gradually reduced until the voltage across the smoothing capacitor $C_1$ had decreased to zero. With this gain an input sensitivity of the whole FM-receiver of approximately 30 μV/3 dB was measured.

Generally, at an input sensitivity less than 40 μV/3 dB, that is to say an overall noise gain from aerial input $b_1$ to the diodes $D_1$, $D_2$ of less than 105 dB, a noise factor of the RF-input stage of less than 4 dB and an IF-passband less than 100 kHz insufficient noise is produced to keep the silicon diodes $D_1$ and $D_2$ in the conducting stage. Within the range which is defined by these limit values an adequate operation of the measures in accordance with the invention can be obtained.

The amount of noise applied to the diodes $D_1$ and $D_2$ of the ratio detector R is predominantly determined by the RF-input noise occurring at the RF-input stage and which, after mixing, is within the IF-passband of the IF-filters $F_1$ and $F_2$ and is thereafter amplified in the transistor $T_1$ and the IF-circuit A. The noise voltage required for a sufficient diode biasing can therefore be obtained with different combinations of amounts of input noise, IF-bandwidth and IF-amplification. It is alternatively possible to insert additional noise into the portion of the FM-channel preceding the diodes $D_1$ and $D_2$, so as to realize the required noise voltage. For a person skilled in the art it will not be difficult to conceive different receiver constructions within the limitations of the main claim, the noise applied to the silicon diodes $D_1$ and $D_2$ producing a diode bias which is sufficiently large to keep diodes in the conducting state, even at small signals.

Figure 4:
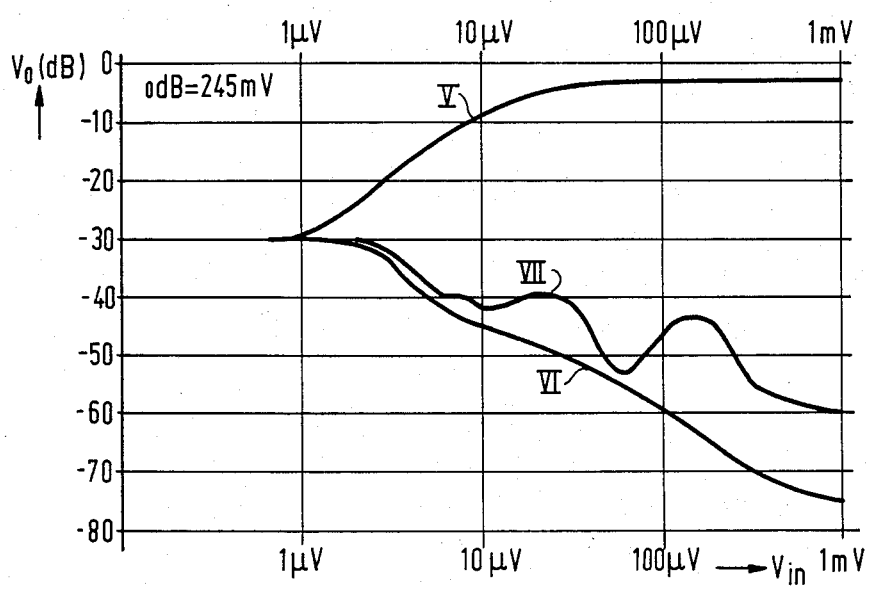
FIG. 4 shows some curves in which the behaviour of the FM-receiver in accordance with the invention is shown as regards the signal-to-noise ratio, the noise and the limitation of amplitude variations, as a function of a test signal at the aerial input.

In FIG. 4 the behaviour is measured of the FM-receiver shown in FIG. 3 as regards detection, noise and amplitude limitations. The measuring curve V is obtained by measuring the amplitude of the signal at the output 2 of the ratio detector R as a function of an amplitude variation of an FM-test signal applied to the RF-input terminal $b_1$ with a frequency swing of $22\frac{1}{2}$ kHz and a modulation frequency of 1 kHz. The input sensitivity of the FM-receiver was adjusted to 15 $\mu$V/3dB. The same was measured in FIG. 5 but then using germanium diodes of the type AA119 as the detection diodes $D_1$ and $D_2$ and represented by means of measuring curve VIII. In spite of the difference in threshold voltage between germanium and silicon diodes no noticeable difference was found in the detection behaviour.

Measuring curve VI in FIG. 4 shows the variation of the amplitude of the output signal of the ratio detector R at an amplitude variation of an unmodulated RF-measuring signal, silicon diodes being used. The same is shown by means of measuring curve IX in FIG. 5, when germanium diodes are used. Also for the noise behaviour the use of germanium or silicon diodes does not produce a noticeable difference.

Figure 5:
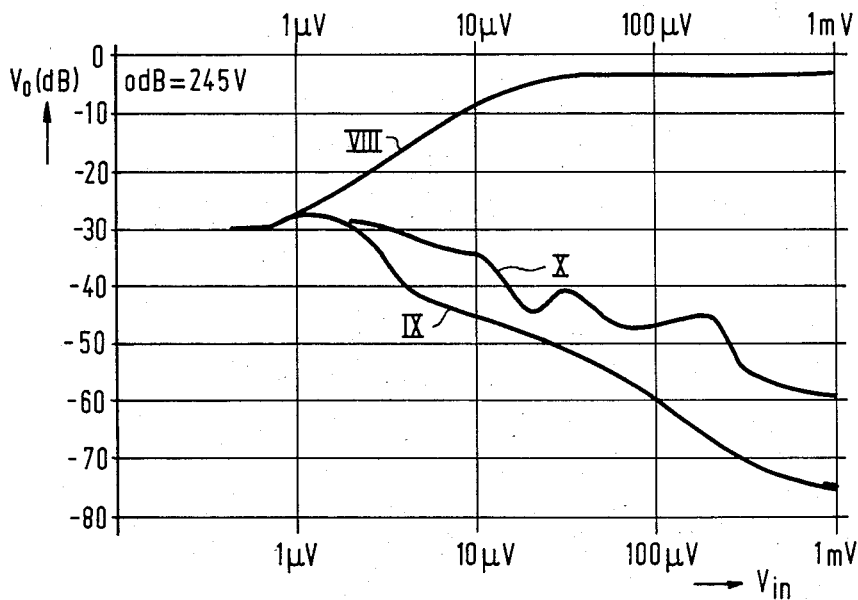
FIG. 5 is the same as FIG. 4 but where germanium diodes are used in the ratio detector.

The same can be concluded as regards the limitation of amplitude variations. In FIG. 4 measuring curve VII shows the variation of the magnitude of amplitude modulations in the output signal of the ratio detector R at an amplitude variation of an RF test signal which is amplitude-modulated by a constant modulation index 0.3, silicon diodes being used, and FIG. 5 shows the same by means of measuring curve X for the case that germanium diodes were used.

What is claimed is:

1. An FM-receiver comprising an FM-channel coupled to an aerial input for receiving an FM signal, the FM-channel comprising in succession an RF-input stage, a mixer stage, an IF-circuit having an IF bandwidth and a ratio detector, the ratio detector including silicon detector diodes for detection of the FM signal and a smoothing capacitor conductively connected to said diodes for a dynamic amplitude limitation of the ratio detector output signal in dependence on the amplitude of the ratio detector input signal, characterized in amplifier means for adjusting the total gain of the FM signal between the aerial input and the ratio detector, and generating an average noise voltage from a noise component of the FM signal within the IF bandwidth, said average noise voltage corresponding to a threshold voltage of the silicon detector diodes, said amplifier means applying the average noise voltage to the silicon detector diodes to produce an average noise current in the silicon detector diodes at least equal to a forward current of the silicon detector diodes, the average noise current producing a d.c. voltage deviating from zero across the smoothing capacitor.

2. An FM-receiver as set forth in claim 1, wherein the FM signal at the aerial input has a noise factor of at least 4 dB, the IF-circuit has a bandwidth of at least 100 kHz and the FM-channel has an input sensitivity of less than 40 microvolts per 3 dB.

3. AN FM-receiver as set forth in claim 2 wherein the FM signal at the aerial input has a noise factor of 5 dB, the IF-circuit has a bandwidth of 150 kHz and the FM-channel has an input sensitivity of 10 microvolts per 3 dB.

* * * * *